(12) United States Patent
Machida et al.

(10) Patent No.: US 8,476,677 B2
(45) Date of Patent: *Jul. 2, 2013

(54) SEMICONDUCTOR DEVICE

(75) Inventors: Osamu Machida, Niiza (JP); Akio Iwabuchi, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/466,565

(22) Filed: May 8, 2012

(65) Prior Publication Data

US 2012/0217546 A1 Aug. 30, 2012

Related U.S. Application Data

(62) Division of application No. 12/640,560, filed on Dec. 17, 2009, now Pat. No. 8,188,515.

(30) Foreign Application Priority Data

Dec. 22, 2008 (JP) ................................. 2008-325409

(51) Int. Cl.
*H01L 29/66* (2006.01)

(52) U.S. Cl.
USPC .............. 257/194; 257/E21.45; 257/E21.451; 257/E29.246; 438/167; 438/176

(58) Field of Classification Search
USPC ............. 438/176, 167; 257/E21.45, E21.451, 257/E29.246

See application file for complete search history.

(56) References Cited

U.S. PATENT DOCUMENTS

| | | | |
|---|---|---|---|
| 2006/0060871 A1* | 3/2006 | Beach | 257/94 |
| 2006/0228477 A1 | 10/2006 | Zhang et al. | |
| 2007/0228477 A1* | 10/2007 | Suzuki et al. | 257/368 |

FOREIGN PATENT DOCUMENTS

| | | |
|---|---|---|
| CN | 101273458 A | 9/2008 |
| JP | 2005-244072 | 9/2005 |
| JP | 2006-32650 | 2/2006 |
| JP | 2007-19309 | 1/2007 |
| WO | WO 03/071607 A1 | 8/2003 |

OTHER PUBLICATIONS

Office Action issued Jun. 21, 2011, in Chinese Patent Application No. 200911000022.3 with English translation.

* cited by examiner

*Primary Examiner* — Michael Lebentritt
*Assistant Examiner* — Aaron Dehne
(74) *Attorney, Agent, or Firm* — Oblon, Spivak, McClelland, Maier & Neustadt, L.L.P.

(57) ABSTRACT

An aspect of the present invention inheres in a semiconductor device includes a semiconductor region, a source electrode and a drain electrode, which are provided on a main surface of the semiconductor region, a gate electrode exhibiting normally-off characteristics, the gate electrode being provided above the main surface of the semiconductor region while interposing a p-type material film therebetween, and being arranged between the source electrode and the drain electrode, and a fourth electrode that is provided on the main surface of the semiconductor region, and is arranged between the gate electrode and the drain electrode.

11 Claims, 8 Drawing Sheets

SEMICONDUCTOR DEVICE

CROSS REFERENCE TO RELATED APPLICATIONS

This application is a divisional of U.S. Ser. No. 12/640,560 filed Dec. 17, 2009, which claims priority under 35 U.S.C. 119 to Japanese Application No. P2008-325409 filed Dec. 22, 2008, the entire contents of both of which are incorporated herein by reference.

BACKGROUND OF THE INVENTION

1. Field of the Invention

The present invention relates to a semiconductor device having normally-off characteristics, and in particular, relates to a semiconductor device having resistance to a high voltage.

2. Description of the Related Art

A field-effect transistor device such as a high electron mobility transistor (HEMT) and a metal semiconductor field effect transistor (MESFET), each of which has a heterojunction for generating a two-dimensional carrier gas layer that serves as a conduction path of carriers, generally has normally-on characteristics. In order to turn off the HEMT, the MESFET or the like, which has the normally-off characteristics, a negative power supply for setting a gate electrode thereof at a negative potential is required, and an electric circuit is necessarily increased in price. Accordingly, a semiconductor device having normally-off characteristics is required (for example, refer to Japanese Patent Laid-Open Publication No. 2007-19309).

In order to form the semiconductor device having the normally-off characteristics, a special gate structure is frequently adopted. As this special gate structure for imparting the normally-off characteristics to the semiconductor device concerned, a stacked gate structure composed of metal, an insulating material, a semiconductor and the like is known in addition to a recess gate structure as contrivance of a shape to thin an electron supply layer (for example, refer to Japanese Patent Laid-Open Publication No. 2006-32650, Pamphlet of International Publication No. 2003/71607 and Japanese Patent Laid-Open Publication No. 2005-244072). Owing to process restrictions, these gate structures are fabricated by using a technology such as thermal evaporation, electron beam (EB) evaporation, sputtering and chemical vapor deposition (CVD), which are capable of performing deposition at a relatively low temperature.

However, in the above-described semiconductor device having the special gate structure for imparting the normally-off characteristics thereto, in the case of targeting the semiconductor device concerned to a power device to be used at a high voltage, there has been a problem that the gate structure may be highly possibly broken as a result of being incapable of withstanding the high voltage, and that reliability of the semiconductor device is thereby low.

SUMMARY OF THE INVENTION

An aspect of the present invention inheres in a semiconductor device includes a semiconductor region, a source electrode and a drain electrode, which are provided on a main surface of the semiconductor region, a gate electrode exhibiting normally-off characteristics, the gate electrode being provided above the main surface of the semiconductor region while interposing a p-type material film therebetween, and being arranged between the source electrode and the drain electrode, and a fourth electrode that is provided on the main surface of the semiconductor region, and is arranged between the gate electrode and the drain electrode.

DETAILED DESCRIPTION OF EXEMPLARY EMBODIMENTS OF THE INVENTION

Figure 1:
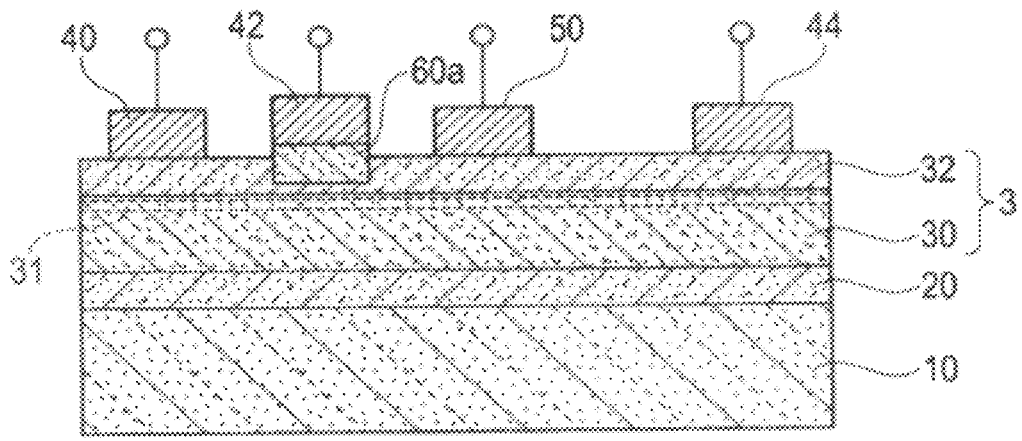
FIG. 1 is a schematic cross-sectional view of a semiconductor device according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific signal values, etc. to provide a thorough understanding of the present invention. However, it will be obvious to those skilled in the art that the present invention may be practiced without such specific details.

First Embodiment

As shown in FIG. 1, a semiconductor device according to a first embodiment of the present invention includes: a semiconductor region 3; a source electrode (first electrode) 40 and a drain electrode (second electrode) 44, which are provided on a main surface of the semiconductor region 3; a gate electrode (third electrode) 42 that exhibits normally-off characteristics, is provided above the main surface of the semiconductor region 3 while interposing a p-type material film 60a therebetween, and is arranged between the source electrode 40 and the drain electrode 44; and a fourth electrode 50 that is provided on the main surface of the semiconductor region 3, and is arranged between the gate electrode 42 and the drain electrode 44. The semiconductor region 3 is stacked on a buffer layer 20 that is made of aluminum nitride (AlN) or the like, and is provided on a support substrate 10 made of sapphire, silicon, silicon carbide or the like. The semiconductor device according to the first embodiment, which is shown in FIG. 1, is an HEMT.

The semiconductor region 3 includes: a first semiconductor layer 30; and a second semiconductor layer 32 that is stacked on a main surface of the first semiconductor layer 30, and generates a two-dimensional carrier (electron) gas layer (2 DEG layer) 31 immediately under the main surface of the first semiconductor layer 30. The first semiconductor layer 30 is composed of a nitride compound semiconductor such as gallium nitride (GaN) having a thickness, for example, of 1 to 3 μm, and the first semiconductor layer 30 functions as an electron transit layer. The second semiconductor layer 32 is composed of a nitride compound semiconductor such as aluminum gallium nitride (AlGaN) having a thickness, for example, of 5 to 50 nm (more preferably, 5 to 30 nm) thinner than that of the first semiconductor layer 30, and the second semiconductor layer 32 functions as an electron supply layer.

The first semiconductor layer 30 and the second semiconductor layer 32 are made of the nitride compound semiconductors different in type from each other, and are composed so that band gap energy of the second semiconductor layer 32 can be larger than that of the first semiconductor layer 30, and that a lattice constant of the second semiconductor layer 32 can be smaller than that of the first semiconductor layer 30. Therefore, an interface between the first semiconductor layer 30 and the second semiconductor layer 32 forms a heterointerface, and in the first semiconductor layer 30 in the vicinity of the interface concerned, such a 2 DEG layer 31 is generated by an electric field generated by piezoelectric polarization between the first semiconductor layer 30 and the second semiconductor layer 32 or by spontaneous polarization of the second semiconductor layer 32.

The source electrode 40 and the drain electrode 44 are electrically connected to the 2 DEG layer 31. The source electrode 40 and the drain electrode 44 are composed, for example, of titanium (Ti), aluminum (Al) and the like. Ti, Al and the like, which are for use in the source electrode 40 and the drain electrode 44, have small work functions. Accordingly, each pair of the source electrode 40 and the second semiconductor layer 32 and the drain electrode 44 and the second semiconductor layer 32 is adapted to be brought into ohmic contact (low-resistance contact) with each other in such a manner that the source electrode 40 and the drain electrode 44 are subjected to annealing treatment.

The gate electrode 42 is provided on a gate structure for imparting the normally-off characteristics to the semiconductor device. Specific examples of the gate structure for the gate electrode 42 will be listed below.

Figure 2:
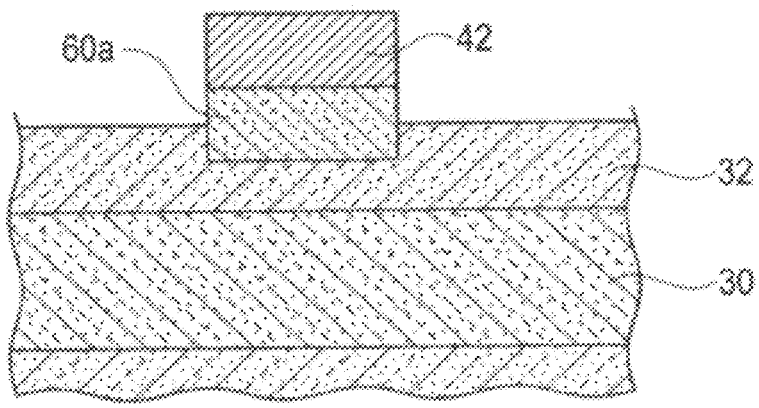
FIG. 2 is a schematic cross-sectional view (No. 1) of a gate structure for a gate electrode in the semiconductor device according to the first embodiment of the present invention.

(A) As shown in FIG. 1 and FIG. 2, for example, a gate structure has a recess structure formed by removing a part of the main surface of the semiconductor region 3 (second semiconductor layer 32). In terms of depth, the recess structure shown in FIG. 1 and FIG. 2 does not reach the first semiconductor layer 30, and remains within the second semiconductor layer 32. Moreover, the gate structure shown in FIG. 1 and FIG. 2 is a p-type gate structure in which the gate electrode 42 is provided above the formed recess structure while interposing the p-type material film 60a therebetween.

Figure 3:
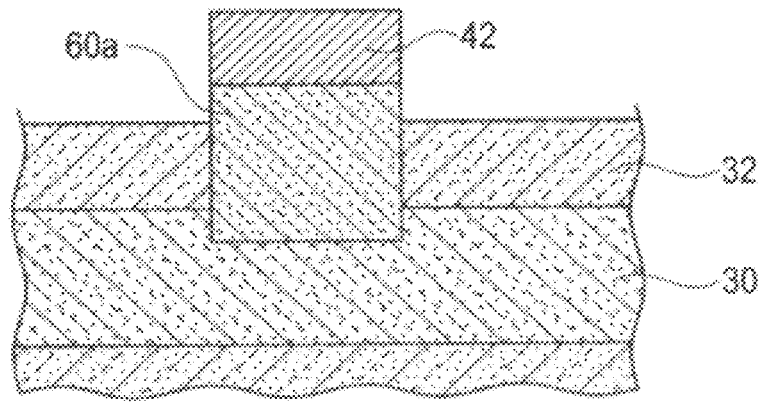
FIG. 3 is a schematic cross-sectional view (No. 2) of a gate structure for the gate electrode in the semiconductor device according to the first embodiment of the present invention.

(B) As shown in FIG. 3, for example, a gate structure has a recess structure formed by removing a part of the main surface of the semiconductor region 3 (first semiconductor layer 30 and second semiconductor layer 32). In terms of depth, the recess structure shown in FIG. 3 reaches the first semiconductor layer 30. Moreover, the gate structure shown in FIG. 3 is a p-type gate structure in which the gate electrode 42 is provided above the formed recess structure while interposing the p-type material film 60a therebetween.

Figure 4:
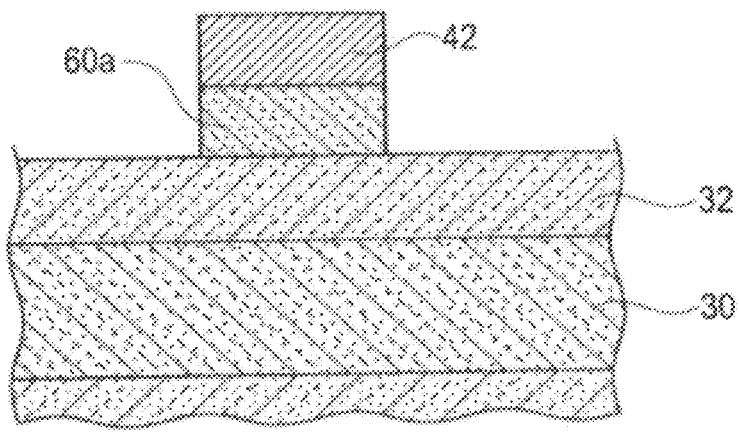
FIG. 4 is a schematic cross-sectional view (No. 3) of a gate structure for the gate electrode in the semiconductor device according to the first embodiment of the present invention.

(C) As shown in FIG. 4, for example, a gate structure is a p-type gate structure, in which the p-type material film 60a is provided on the main surface of the semiconductor region 3 (second semiconductor layer 32), and the gate electrode 42 is provided above the main surface of the semiconductor region 3 while interposing the p-type material film 60a therebetween.

Figure 5:
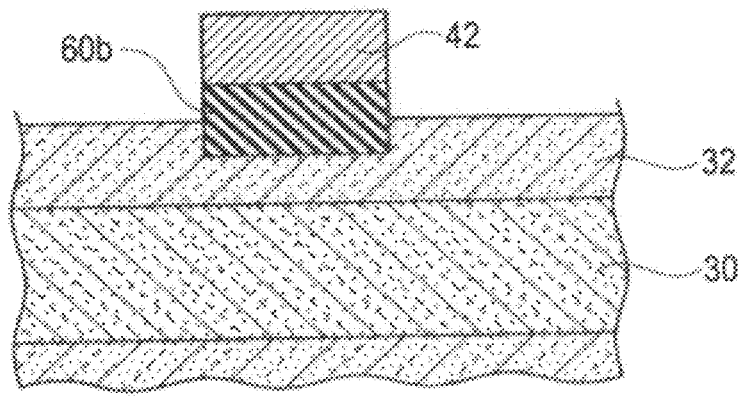
FIG. 5 is a schematic cross-sectional view (No. 4) of a gate structure for the gate electrode in the semiconductor device according to the first embodiment of the present invention.

(D) As shown in FIG. 5, for example, a gate structure has a recess structure formed by removing a part of the main surface of the semiconductor region 3 (second semiconductor layer 32). In terms of depth, the recess structure shown in FIG. 5 does not reach the first semiconductor layer 30, and remains within the second semiconductor layer 32. Moreover, the gate structure shown in FIG. 5 is an insulating gate structure (MIS structure) in which the gate electrode 42 is provided above the formed recess structure while interposing the insulating film 60b therebetween.

Figure 6:
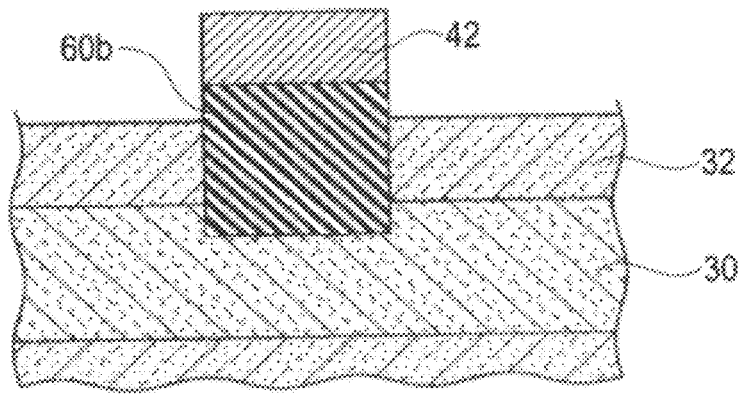
FIG. 6 is a schematic cross-sectional view (No. 5) of a gate structure for the gate electrode in the semiconductor device according to the first embodiment of the present invention.

(E) As shown in FIG. 6, for example, a gate structure has a recess structure formed by removing a part of the main surface of the semiconductor region 3 (first semiconductor layer 30 and second semiconductor layer 32). In terms of depth, the recess structure shown in FIG. 6 reaches the first semiconductor layer 30. Moreover, the gate structure shown in FIG. 6 is an MIS structure in which the gate electrode 42 is provided above the formed recess structure while interposing the insulating film 60b therebetween. In the case of this structure, a threshold value of the FET can be increased.

Figure 7:
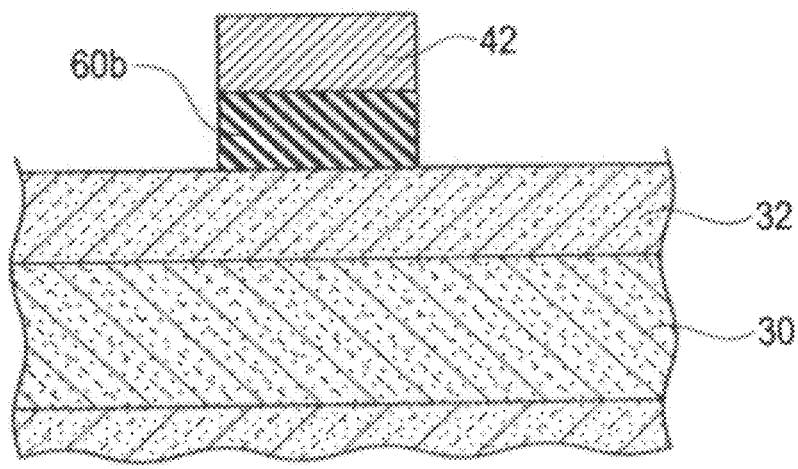
FIG. 7 is a schematic cross-sectional view (No. 6) of a gate structure for the gate electrode in the semiconductor device according to the first embodiment of the present invention.

(F) As shown in FIG. 7, for example, a gate structure is an MIS structure, in which the insulating film 60b is provided on the main surface of the semiconductor region 3 (second semiconductor layer 32), and the gate electrode 42 is provided above the main surface of the semiconductor region 3 while interposing the insulating film 60b therebetween.

Figure 8:
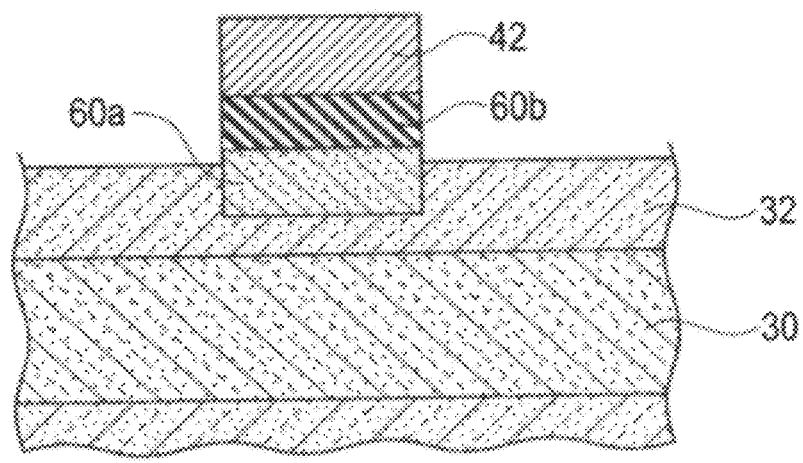
FIG. 8 is a schematic cross-sectional view (No. 7) of a gate structure for the gate electrode in the semiconductor device according to the first embodiment of the present invention.

(G) As shown in FIG. 8, for example, a gate structure has a recess structure formed by removing a part of the main surface of the semiconductor region 3 (second semiconductor layer 32). In terms of depth, the recess structure shown in FIG. 8 does not reach the first semiconductor layer 30, and remains within the second semiconductor layer 32. Moreover, the gate structure shown in FIG. 8 is a composite structure of the p-type gate structure and the MIS structure, in which the gate electrode 42 is provided above the formed recess structure while interposing the p-type material film 60a and the insulating film 60b therebetween.

Figure 9:
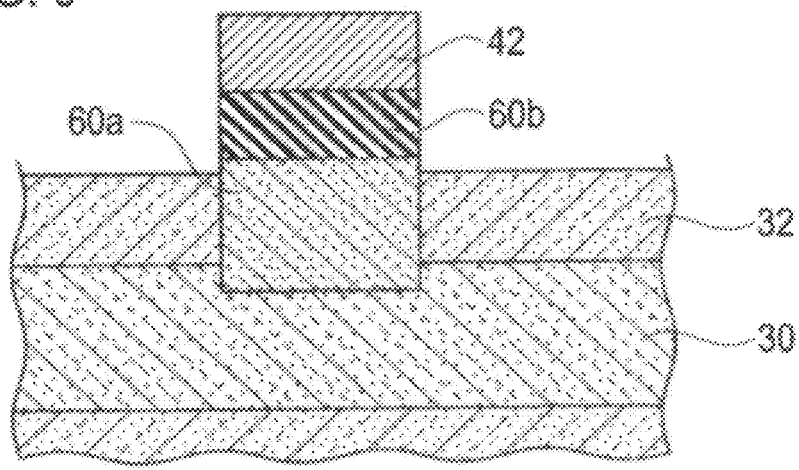
FIG. 9 is a schematic cross-sectional view (No. 8) of a gate structure for the gate electrode in the semiconductor device according to the first embodiment of the present invention.

(H) As shown in FIG. 9, for example, a gate structure has a recess structure formed by removing a part of the main surface of the semiconductor region 3 (first semiconductor layer 30 and second semiconductor layer 32). In terms of depth, the recess structure shown in FIG. 9 reaches the first semiconductor layer 30. Moreover, the gate structure shown in FIG. 9 is a composite structure of the p-type gate structure and the MIS structure, in which the gate electrode 42 is provided above the formed recess structure while interposing the p-type material film 60a and the insulating film 60b therebetween.

Figure 10:
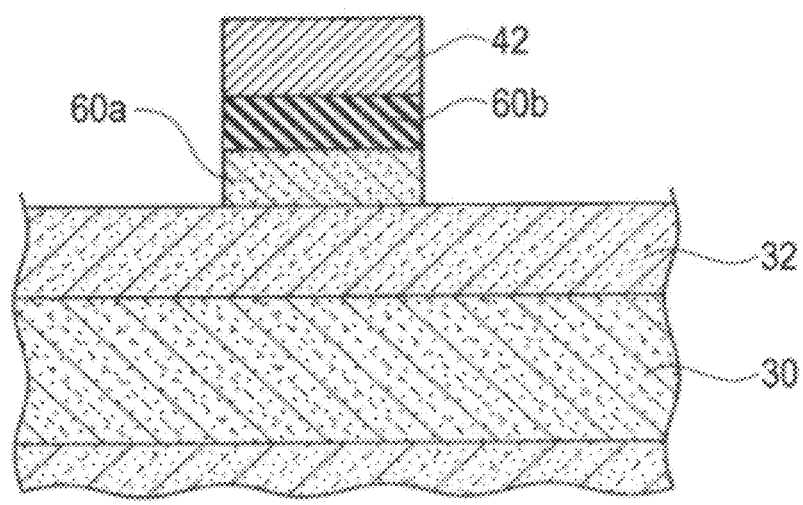
FIG. 10 is a schematic cross-sectional view (No. 9) of a gate structure for the gate electrode in the semiconductor device according to the first embodiment of the present invention.

(I) As shown in FIG. 10, for example, in a gate structure, the p-type material film 60a is formed on the main surface of the semiconductor region 3 (second semiconductor layer 32), and the insulating film 60b is further formed on the p-type material film 60a. The gate electrode 42 is provided above the main surface of the semiconductor region 3 while interposing the p-type material film 60a and the insulating film 60b therebetween. The gate structure shown in FIG. 10 is a composite structure of the p-type gate structure and the MIS structure, in which the gate electrode 42 is provided above the main surface of the semiconductor region 3 while interposing the p-type material film 60a and the insulating film 60b therebetween.

The gate electrode 42 is formed of a stacked body or alloy of nickel (Ni,), gold (Au), Ti, Al and the like. The p-type material film 60a is formed of GaN, AlInGaN, each of which is doped with p-type impurities such as magnesium (Mg) or a metal oxide such as nickel oxide (NiO(x)). Value x is arbitrary numerical value, and, for example, x is 1. The insulating film 60b is formed of silicon dioxide ($SiO_2$), silicon nitride ($Si_3N_4$), aluminum oxide ($Al_2O_3$), hafnium oxide (HfO), aluminum nitride (AlN) or the like.

Note that the gate structure for the gate electrode 42 is not limited to the above-mentioned structures. For example, the gate structure may have a structure in which the gate electrode 42 is provided on a stacked body composed of a plurality of the p-type material films 60a and a plurality of the insulating films 60b.

Figure 11:
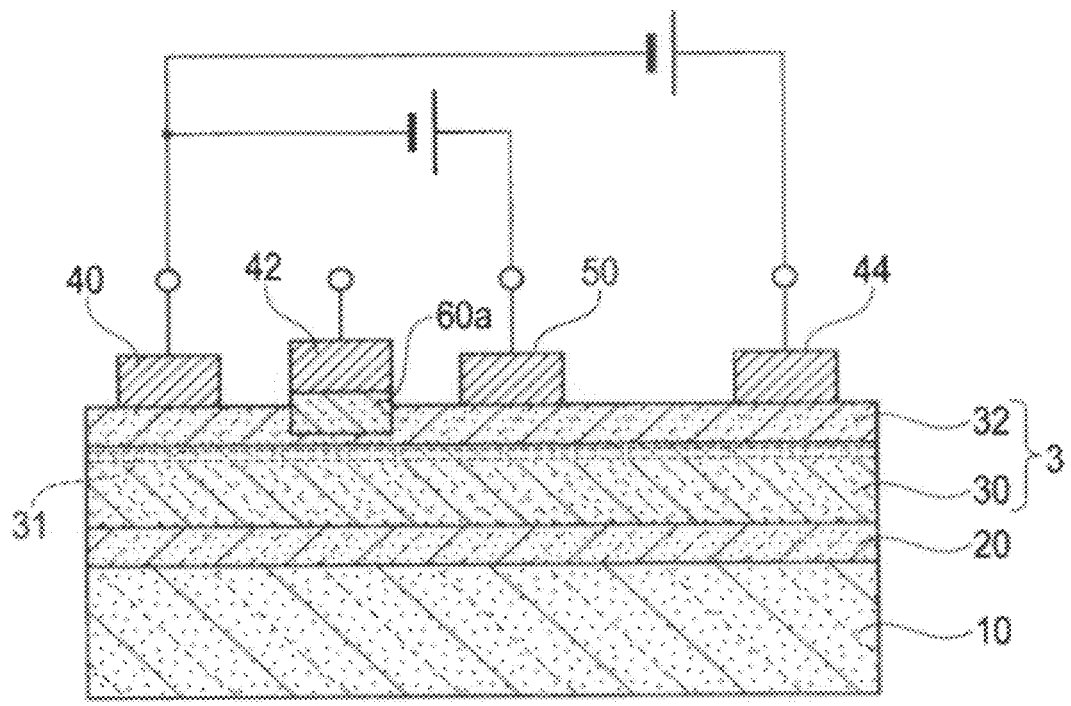
FIG. 11 is a schematic cross-sectional view for explaining operations of the semiconductor device according to the first embodiment of the present invention.

The fourth electrode 50 is provided between the gate electrode 42 and the drain electrode 44, and has a function to prevent a breakage of the gate electrode 42 at the time when a high voltage is applied thereto. In the conventional HEMT, MESFET or the like, at the time of an OFF operation, a voltage as high as several hundred voltages is applied between the gate electrode and the drain electrode, an electric field is concentrated on an end of the gate electrode on the drain electrode side, and accordingly, the insulating film or the like as a gate material is sometimes broken. In this connection, as shown in FIG. 11, zero to several voltages are applied in advance to the fourth electrode 50 while taking a source voltage as a reference, whereby, at the time of the OFF operation, such a voltage as high as several hundred voltages will be applied between the drain electrode 44 and the fourth electrode 50, and a high voltage (intense electric field) will not be applied to the gate electrode 42. In such a way, the breakage of the gate electrode 42 can be prevented.

Accordingly, the fourth electrode 50 is required to have a highly reliable structure that is not broken even if the high voltage is applied thereto. Specific examples of the fourth electrode 50 having the highly reliable structure that is not broken even if the high voltage is applied thereto will be listed below.

Figure 12:
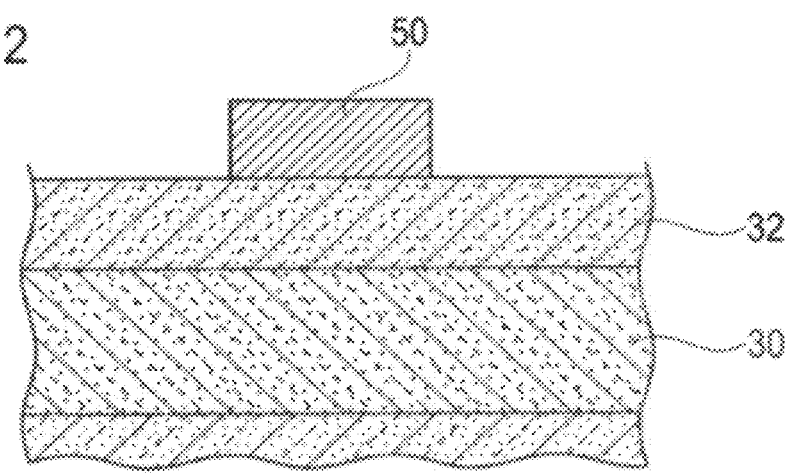
FIG. 12 is a schematic cross-sectional view (No. 1) of a fourth electrode in the semiconductor device according to the first embodiment of the present invention.

(A) As shown in FIG. 11 and FIG. 12, for example, the fourth electrode 50 is a Schottky electrode in Schottky contact with the main surface of the semiconductor region 3 (second semiconductor layer 32). The fourth electrode 50 as the Schottky electrode is formed of a stacked body or alloy of Ni, Au, Ti, rhodium (Rh), Al and the like.

Figure 13:
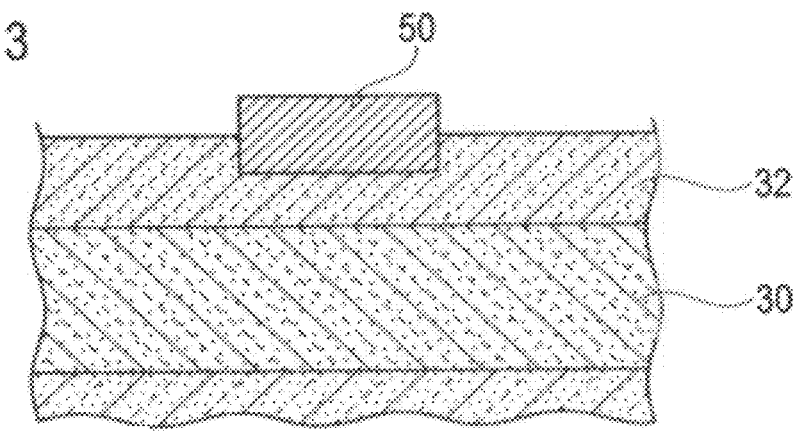
FIG. 13 is a schematic cross-sectional view (No. 2) of a fourth electrode in the semiconductor device according to the first embodiment of the present invention.

(B) As shown in FIG. 13, for example, the fourth electrode 50 is a Schottky electrode that is provided on the recess structure formed by removing a part of the main surface of the semiconductor region 3 (second semiconductor layer 32), and is in Schottky contact with the second semiconductor layer 32. The fourth electrode 50 as the Schottky electrode is formed of a stacked body or alloy of Ni, Au, Ti, Rh, Al and the like.

Figure 14:
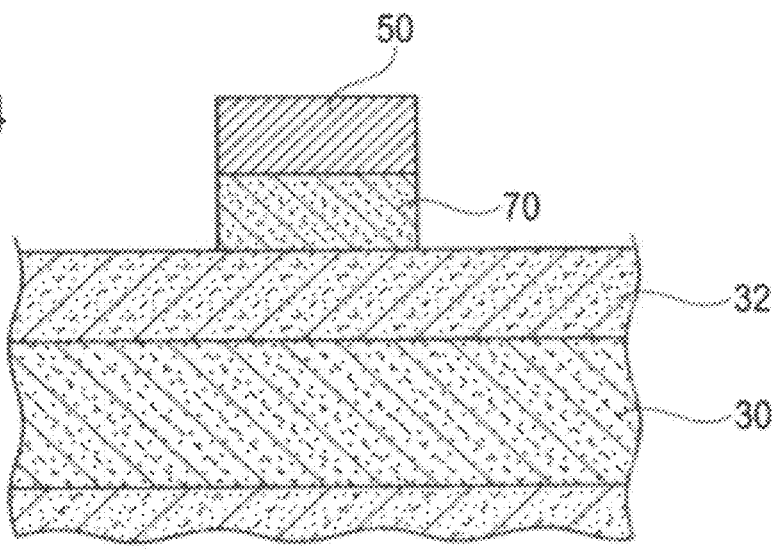
FIG. 14 is a schematic cross-sectional view (No. 3) of a fourth electrode in the semiconductor device according to the first embodiment of the present invention.

(C) As shown in FIG. 14, for example, the fourth electrode 50 is provided above the main surface of the semiconductor region 3 (second semiconductor layer 32) while interposing a p-type material film 70 therebetween. At this time, it is preferable that the fourth electrode 50 and the p-type material film 70 be adapted to be brought into ohmic contact (low-resistance contact) with each other. The fourth electrode 50 is formed of a stacked body or alloy of Ni, Au, Ti, Al and the like. Moreover, the p-type material film 70 is composed of a nitride compound semiconductor material such as gallium nitride (GaN), aluminum indium gallium nitride (AlInGaN), a metal oxide such as nickel oxide (NiO(x)), a semiconductor material such as silicon (Si) and germanium (Ge), or of a compound semiconductor material such as silicon germanium (SiGe) made of Si and Ge, each of which is doped with the p-type impurities.

Figure 15:
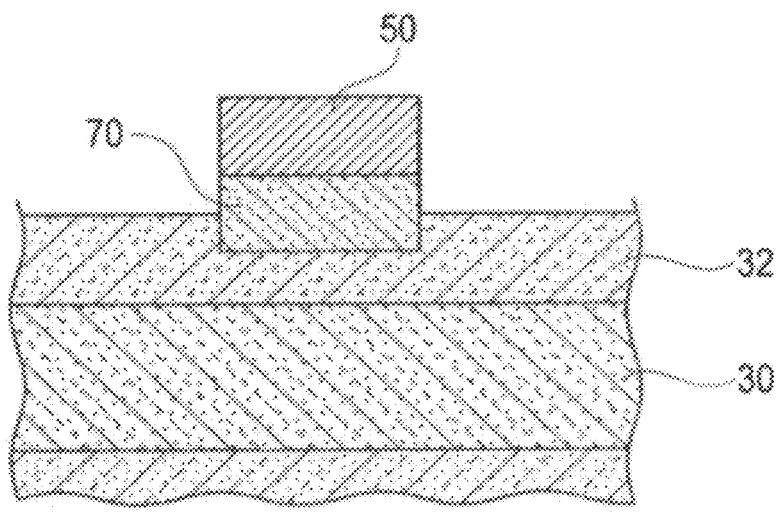
FIG. 15 is a schematic cross-sectional view (No. 4) of a fourth electrode in the semiconductor device according to the first embodiment of the present invention.

(D) As shown in FIG. 15, for example, the fourth electrode 50 is provided above the recess structure, which is formed by removing a part of the main surface of the semiconductor region 3 (second semiconductor layer 32), while interposing the p-type material film 70 therebetween. At this time, it is preferable that the fourth electrode 50 and the p-type material film 70 be adapted to be brought into ohmic contact (low-resistance contact) with each other. The fourth electrode 50 is formed of a stacked body or alloy of Ni, Au, Ti, Al and the like. Moreover, the p-type material film 70 is composed of the nitride compound semiconductor material such as AlInGaN, the semiconductor material such as Si and Ge, or the compound semiconductor material such as SiGe made of Si and Ge, each of which is doped with the p-type impurities.

A description will be made below of the normally-off characteristics inherent in the semiconductor device according to the first embodiment.

When a gate control signal for a normal ON operation is not applied between the gate electrode 42 and the source electrode 40, the p-type material film 60a raises a potential of the first semiconductor layer 30 located immediately below the gate electrode 42, and depletes electrons of the 2 DEG layer 31, whereby the 2 DEG layer 31 located immediately below the gate electrode 42 disappears. Specifically, the p-type material film 60a (and the vicinity of the insulating film 60b) forms a depletion layer in the first semiconductor layer 30 (2 DEG layer 31). Specifically, in a normal state where a bias voltage is not applied to the gate electrode 42, the depletion layer is formed in the 2 DEG layer 31, and a flow of the electrons between the source electrode 40 and the drain electrode 44 is blocked, whereby the normally-off characteristics are obtained.

Moreover, in the semiconductor device according to the first embodiment, the recess is provided immediately below the gate electrode 42, and the second semiconductor layer 32 as the electron supply layer is partially thinned. In such a way, the electric field, which is generated by the piezoelectric polarization that is based on such a heterojunction between the electron supply layer and the electron transit layer and by the spontaneous polarization of the electron supply layer, is weakened, and a concentration of the 2 DEG layer 31 is decreased. Therefore, it becomes easy for the semiconductor device to obtain the normally-off characteristics.

In accordance with the semiconductor device according to the first embodiment of the present invention, even in the case where such a special gate structure as the recess structure for imparting the normally-off characteristics to the semiconductor device concerned is provided, the high voltage (intense electric field) is applied to the fourth electrode 50 in place of the gate electrode 42, and accordingly, it becomes less possible that the gate electrode 42 may be broken by being applied with the high voltage. Moreover, if the fourth electrode 50 is the Schottky electrode or the like, which is highly reliable even at the high voltage, then it becomes less possible that the semiconductor device according to the first embodiment may be broken even in the case of being targeted to a power device, and reliability of the semiconductor device is enhanced.

Second Embodiment

Figure 16:
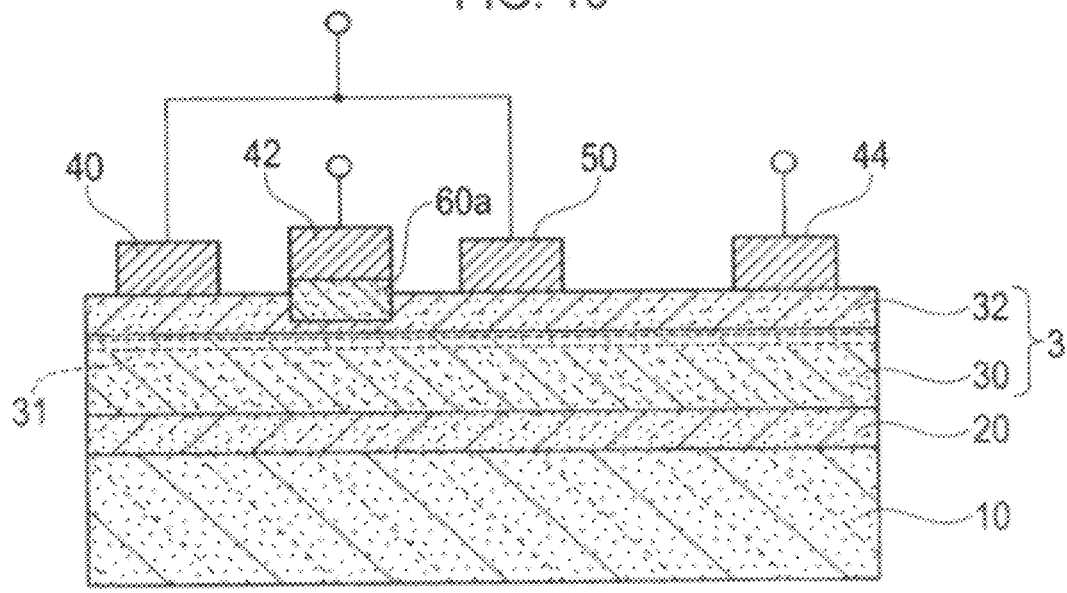
FIG. 16 is a schematic cross-sectional view of a semiconductor device according to a second embodiment of the present invention.

As shown in FIG. 16, a semiconductor device according to a second embodiment of the present invention is different from the semiconductor device according to the first embodiment, which is shown in FIG. 1, in that the fourth electrode 50 and the source electrode 40 are short-circuited with each other. Others in the second embodiment are substantially similar to those in the first embodiment, and accordingly, a duplicate description will be omitted.

The fourth electrode 50 and the source electrode 40 are short-circuited with each other by being connected to each other by a conductive material. A current between the fourth electrode 50 and the drain electrode 44 flows when a potential of the source electrode 40 is higher than that of the drain electrode 44.

The semiconductor device according to the second embodiment, which is configured as described above, can also obtain similar effects to those of the semiconductor device according to the first embodiment.

Moreover, in accordance with the semiconductor device according to the second embodiment, the fourth electrode 50 and the source electrode 40 are short-circuited with each other, whereby the semiconductor device can be used by a similar control to that for the conventional three-terminal FET composed of the source electrode, the gate electrode and the drain electrode.

Third Embodiment

A semiconductor device according to a third embodiment of the present invention is different from the semiconductor device according to the first embodiment, which is shown in FIG. 1, in that a contact surface of the fourth electrode 50 and the semiconductor region 3 exhibits rectifying characteristics. Others in the third embodiment are substantially similar to those in the first embodiment, and accordingly, a duplicate description will be omitted.

Figure 17:
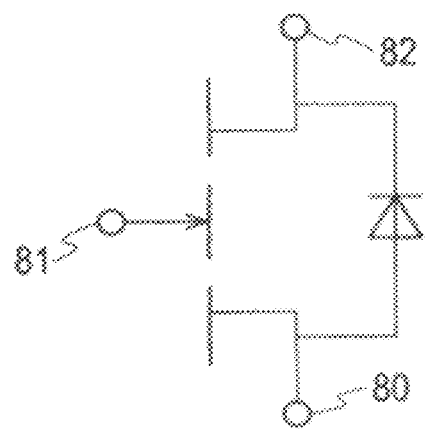
FIG. 17 is a diagram showing an equivalent circuit of a semiconductor device according to a third embodiment of the present invention, the semiconductor device including a Schottky barrier diode between a fourth electrode and a drain electrode.

If the fourth electrode 50 is the Schottky electrode, then a portion between the fourth electrode 50 and the drain electrode 44 becomes a Schottky barrier diode, and the semiconductor device becomes a semiconductor device that builds a high-speed diode therein. FIG. 17 is a diagram showing an equivalent circuit of the semiconductor device including the Schottky barrier diode between the fourth electrode 50 and the drain electrode 44. An anode of the Schottky barrier diode is connected to a source terminal 80, and a cathode thereof is connected to a drain terminal 82. Hence, the Schottky barrier diode is connected in parallel to the semiconductor device according to the third embodiment, and functions as a feedback diode, a regeneration diode or a protection diode. For example, when an inductive load or a capacitive load is connected to the HEMT, a potential of the drain terminal 82 becomes lower than a potential of the source terminal 80, and a reverse overvoltage is applied to the HEMT in some case. At this time, the Schottky barrier diode is biased in a forward direction, turns to a conductive state, and thereby becomes capable of protecting the HEMT from the reverse overvoltage, or of flowing a regeneration current, that is, a feedback current therethrough. Moreover, a field plate extending toward the drain electrode 44 may be formed from the fourth electrode 50. The field plate relaxes an electric field to be occurred between the fourth electrode 50 and the drain electrode 44. Therefore, the semiconductor device can achieve a high blocking voltage because a leak current flowing through the fourth electrode 50 is reduced.

The semiconductor device according to the third embodiment, which is configured as described above, can also obtain similar effects to those of the semiconductor device according to the first embodiment.

Moreover, in accordance with the semiconductor device according to the third embodiment, an external regeneration diode can be eliminated in bridge connection of an inverter and the like.

Furthermore, in accordance with the semiconductor device according to the third embodiment, a reverse recovery current can be reduced more than that of the conventional fast recovery diode (FRD) composed of a silicon p-i-n structure.

Furthermore, in accordance with the semiconductor device according to the third embodiment, downsizing or cost reduction of a composite semiconductor device with such an additional diode that functions as the feedback diode, the regeneration diode or the protection diode can be achieved.

Fourth Embodiment

Figure 18:
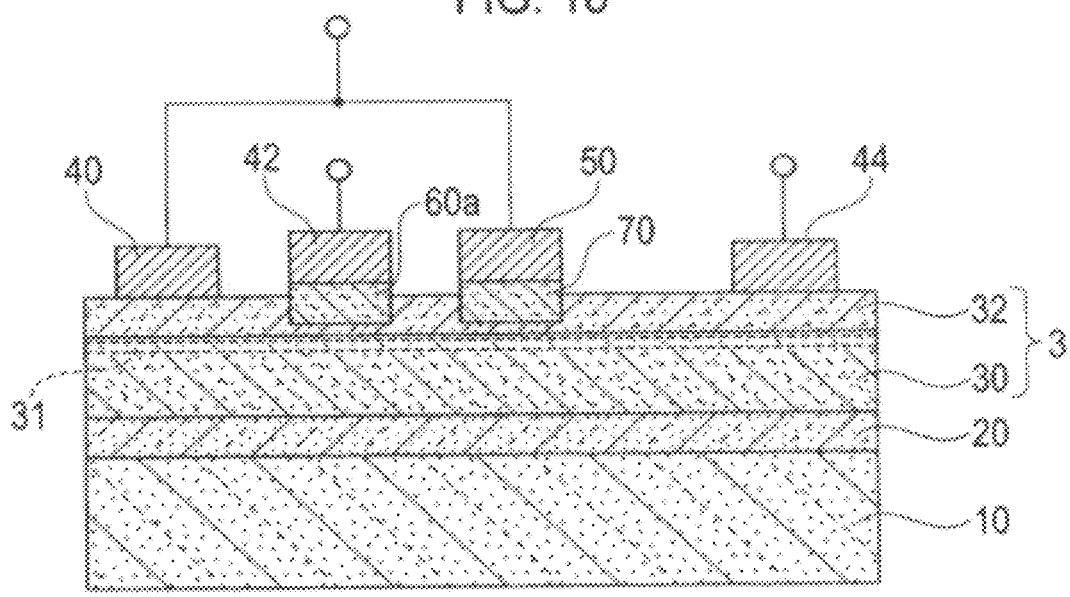
FIG. 18 is a schematic cross-sectional view of a semiconductor device according to a forth embodiment of the present invention.

As shown in FIG. 18, a semiconductor device according to a forth embodiment of the present invention is different from the semiconductor device according to the third embodiment, which is shown in FIG. 16, in that the fourth electrode 50 is structure shown in FIG. 15. Others in the forth embodiment are substantially similar to those in the third embodiment, and accordingly, a duplicate description will be omitted.

That is, the gate structure according to this embodiment is a p-type gate structure in which the gate electrode 42 shown in FIG. 2 is provided above the recess structure while interposing the p-type material film 60a therebetween. Moreover, the fourth electrode 50 according to this embodiment is provided above the main surface of the semiconductor region 3 while interposing a p-type material film 70 therebetween. Moreover, the fourth electrode 50 is provided on the recess structure formed by removing a part of the main surface of the semiconductor region 3 (second semiconductor layer 32).

It is preferable that the fourth electrode 50 is formed of a stacked body same as the gate electrode 42 or alloy of Ni, Au, Ti, Al and the like. It is preferable for the p-type material film 70 to be formed in materials same as the p-type material film 60a. It is preferable for the semiconductor region 3 (second semiconductor layer 32) to remain in under the fourth electrode 50 to have a thickness to be equal to or more than the semiconductor region 3 (second semiconductor layer 32) to remain in under the gate electrode 42. The fourth electrode 50 needs not to be provided above the recess structure.

The semiconductor device according to the forth embodiment, which is configured as described above, can also obtain similar effects to those of the semiconductor device according to the third embodiment.

Furthermore, in accordance with the semiconductor device according to the forth embodiment, a p-n diode is formed between the fourth electrode 50 and drain electrode 44. An equivalent circuit and the function according to this embodiment are constitution same as a semiconductor device according to the third embodiment, which is shown in FIG. 17. The p-n diode can achieve a high blocking voltage and a low leak current in comparison with a shot key barrier diode. Moreover, a production process of the semiconductor device can be made simplified process because the p-type material film 60a, 70, the gate electrode 42 and the fourth electrode 50 can be formed by common process of manufacture.

Other Embodiment

The description has been made as above of the present invention based on the embodiments; however, it should not be understood that the description and the drawings, which compose a part of this disclosure, limit this invention. From this disclosure, various alternative embodiments, examples and operational technologies will become apparent to those skilled in the art.

For example, as described in the first to third embodiments, the semiconductor device according to the present invention is not limited to the simple heterojunction of GaN that composes the first semiconductor layer 30 and AlGaN that composes the second semiconductor layer 32, and it is also possible to add AlInGaN as a cap layer and a spacer layer to the semiconductor device. The cap layer and the spacer layer are added to the semiconductor device, whereby lattice matching between the first semiconductor layer 30 and the second semiconductor layer 32 can be established, and generation of piezoelectric charges can be suppressed.

Moreover, though it has been described that the semiconductor device is the HEMT in the first to third embodiments, the present invention can also be applied to the MESFET in a similar way.

Furthermore, in the first to third embodiments, it is also possible to introduce a field plate structure into the source electrode 40, the gate electrode 42, the drain electrode 44 and the fourth electrode 50. The field plate structure is introduced into the respective electrodes, whereby the concentration of the electric field in the depletion layer on the periphery of each of the electrodes can be relieved.

Furthermore, though it has been described that the carriers which use the two-dimensional carrier gas layer as the conduction path are electrons in the first to third embodiments; however, the carriers may be holes.

Various modifications will become possible for those skilled in the art after receiving the teachings of the present disclosure without departing from the scope thereof.

What is claimed is:

1. A semiconductor device comprising:
a semiconductor region includes a first semiconductor layer and a second semiconductor layer stacked on a main surface of the first semiconductor layer to form a heterointerface therebetween;
a source electrode and a drain electrode, which are provided on a main surface of the semiconductor region;
a gate structure including a gate electrode and exhibiting normally-off characteristics, the gate structure has a recess structure formed by removing a part of the main surface of the semiconductor region and arranged between the source electrode and the drain electrode; and
a fourth electrode that is provided on the main surface of the semiconductor region, and is arranged between the gate electrode and the drain electrode,
wherein the semiconductor region spanning the entirety of a bottom of the fourth electrode has a thickness that is greater relative to the semiconductor region spanning the entirety of the gate electrode.

2. The semiconductor device of claim 1, wherein the fourth electrode is applied to the high voltage (intense electric field) in place of the gate electrode.

3. The semiconductor device of claim 1, wherein the first semiconductor layer is composed of a nitride compound semiconductor, the first semiconductor layer and the second semiconductor layer are made of the nitride compound semiconductors different in type from each other.

4. The semiconductor device of claim 1, wherein the semiconductor region includes a two-dimensional carrier gas layer in the first semiconductor layer.

5. The semiconductor device of claim 1, wherein the gate structure is provided above the recess structure while interposing an insulating film therebetween.

6. The semiconductor device of claim 1, wherein a contact surface of the fourth electrode and the semiconductor region exhibits rectifying characteristics.

7. The semiconductor device of claim 1, wherein the fourth electrode is provided on a recess structure formed by removing a part of the main surface of the semiconductor region.

8. The semiconductor device of claim 1, wherein the fourth electrode is in Schottky contact with the main surface of the semiconductor region.

9. The semiconductor device of claim 1, wherein the fourth electrode is provided above the main surface of the semiconductor region while interposing the p-type material film therebetween.

10. The semiconductor device of claim 9, wherein the p-type material film under the gate electrode is formed in materials same as the p-type material film under the fourth electrode.

11. The semiconductor device of claim 1, wherein the source electrode and the fourth electrode are electrically connected to each other.

* * * * *